US005721401A

United States Patent [19]

Sim

[11] Patent Number: 5,721,401

[45] Date of Patent: Feb. 24, 1998

[54] SUB-WOOFER MODULE

[75] Inventor: Jae-Hoon Sim, Seoul, Rep. of Korea

[73] Assignee: Daewood Electronics Co. Ltd., Seoul, Rep. of Korea

[21] Appl. No.: 690,651

[22] Filed: Jul. 29, 1996

[30] Foreign Application Priority Data

Jul. 28, 1995 [KR] Rep. of Korea ........................ 95-22713

[51] Int. Cl.[6] ........................................ H05K 5/00

[52] U.S. Cl. .......................... 181/148; 181/153; 181/155; 181/156; 181/191; 181/197; 181/199

[58] Field of Search .................................. 181/145, 148, 181/153, 154, 155, 156, 171, 191, 196, 197, 199; 381/88, 90, 160, 186

[56] References Cited

U.S. PATENT DOCUMENTS

| | | | |
|---|---|---|---|
| 1,685,050 | 9/1928 | Gems | 181/199 |
| 2,073,747 | 3/1937 | Koroncai et al. | 181/148 |
| 2,123,442 | 7/1938 | Stone | 181/148 |
| 2,759,553 | 8/1956 | Bosley | 181/145 |
| 4,165,797 | 8/1979 | Spetalnik | 181/147 |
| 4,348,549 | 9/1982 | Berlant | 181/152 |
| 4,630,303 | 12/1986 | Tanno | 181/145 |
| 5,105,905 | 4/1992 | Rice | 181/155 |
| 5,304,747 | 4/1994 | Hale, II | 181/156 |
| 5,418,338 | 5/1995 | Kim | 181/199 |

*Primary Examiner*—Eddie C. Lee
*Attorney, Agent, or Firm*—Foley & Lardner

[57] ABSTRACT

Disclosed is a sub-woofer module which has a simple construction and provides a good low-frequency bass in compliance with an audience's taste. The sub-woofer module has an enclosure, a baffle board which separates the enclosure into first and second chambers, and a speaker coupled to the baffle board. The baffle board is engaged with a screw shaft and moves upward and backward along the screw shaft to vary the volume of the first and second chambers. A reverse-conical cap is disposed above the enclosure to permit the upwardly projected sound to be projected in 360 degrees, and a conical base is disposed below the enclosure to permit the downwardly projected sound to be projected in 360 degrees. The audience can listen to sound of the same quality regardless their position in relation to the sub-woofer module.

27 Claims, 4 Drawing Sheets

SUB-WOOFER MODULE

BACKGROUND OF THE INVENTION

1. Field of the Invention

The present invention relates to a loudspeaker system, and more particularly to a sub-woofer module of a loudspeaker system which has a simple construction and provides a good low-frequency bass in compliance with a user's taste.

2. Prior Art

As is well known, a loudspeaker system is an instrument for transferring sound waves to audience's ears by vibrating air. Generally, the loudspeaker system comprises a woofer for reproducing low-frequencies, a squawker for reproducing midrange-frequencies, and a tweeter for reproducing high-frequencies. As music utilizing low frequencies, such as rap and hip-hop, have recently become popular among the younger generation, various efforts have been made and studies have been done for the purpose of improving the performance of the woofer so that the woofer may reproduce lower frequencies.

The woofer has a cone shape and projects a sound forwards and backwards, simultaneously. However, the forwardly projected sound may be diminished by the backwardly projected sound because they have phases which are opposed to each other. This diminution of the forwardly projected sound is more extreme when the reproduced sound has lower frequencies. Therefore, it is required for reproducing a good bass to separate the forwardly projected sound from the backwardly projected sound in such a manner that the backwardly projected sound does not cancel the forwardly projected sound.

In order to solve the above problem, various types of loudspeaker systems have been proposed. One of them is a closed-type speaker system which retains the backwardly projected sound within an enclosure. However, the closed-type speaker system requires a large enclosure in order to reproduce a good low-frequency bass.

Another conventional speaker system of a bass-reflex type also has been proposed. In the bass reflex type speaker system, the backwardly projected sound is guided to a front exterior through a duct formed at a front side of an enclosure. The enclosure is designed in such a manner that the enclosure has a resonance frequency lower than that of the woofer. Accordingly, the sound projected toward the front exterior through the duct has a lower frequency than the frequency of sound reproduced by the woofer. As a result, the bass reflex type speaker system can reproduce lower frequencies than the closed-type speaker system. However, since both the woofer and enclosure have fixed resonance frequencies, the bass reflex type speaker system cannot provide variability of low-frequencies in compliance with an audience's taste.

U.S. Pat. No. 5,418,338 issued to Kim discloses a speaker box which can produce both a greatly amplified bass and a normal amount of bass.

FIG. 4 shows Kim's speaker box 500 under a normal bass mode.

As shown in FIG. 4, speaker box 500 comprises a central partition 510 which separates speaker box 500 into first and second chambers 512 and 514. A pair of speaker holes 520 are positioned in a from wall of speaker box 500. In addition, a first divider 530 is attached to a first hinge 532 which is affixed to the far left corner of first chamber 512. A first bolt 550 driven by a first motor (not shown) is threadedly attached to a first nut assembly 560 installed within first divider 530. A first cardboard 570 is coupled to a terminal end of first divider 530.

On the other hand, a second divider 540 is attached to a second hinge 542 which is affixed to the far right corner of second chamber 514. A second bolt 552 driven by a second motor (not shown) is threadedly attached to a second nut assembly 562 installed within second divider 540. A second cardboard 572 is coupled with a terminal end of second divider 540.

When a user wishes to listen to amplified bass, the user operates the first and second motors. As the first and second motors operate, first and second bolts 550 and 552 connected thereto rotate so that first and second nut assemblies 560 and 562 move towards a rear wall of speaker box 500 along with first and second bolts 550 and 552. Accordingly, first and second dividers 530 and 540 also move towards the rear wall of speaker box 500, thereby expanding the volume of first and second chambers 512 and 514. First and second chambers 512 and 514 having the expanded volume effectively retain the backwardly projected sound within speaker box 500, so that the sound cancellation caused by the interference of the backwardly projected sound with the forwardly projected sound is reduced. As a result, the user can listen to amplified bass.

However, Kim's speaker box has the disadvantage that first and second chambers 512 and 514 should have a large volume in order to sufficiently absorb the backwardly projected sound.

Further, Kim's speaker box requires a first joint between first bolt 550 and the first motor, and a second joint between second bolt 552 and the second motor to enable the forward and backward movements of first and second dividers 530 and 540. For this reason, not only is the assembling of the speaker box difficult, but also additional steps are required to assemble the speaker box.

Accordingly, it is necessary to provide a loudspeaker system which has a simple construction and provides a good low-frequency bass in compliance with an audience's taste.

SUMMARY OF THE INVENTION

The present invention has been made to overcome the above described problems of the prior art, and accordingly, it is an object of the present invention to provide a sub-woofer module of a loudspeaker system which has a simple construction and provides a good low-frequency bass in compliance with the audience's taste.

To achieve the above objects, the present invention provides a sub-woofer module comprising:

an enclosure;

a first means for separating the enclosure into upper and lower chambers, the first means being moved upward and downward along a longitudinal axis of the enclosure thereby varying volumes of the upper and lower chambers;

a speaker for projecting a sound upward and downward simultaneously, the speaker being incorporated with the first means;

a second means for moving the first means upward and downward; and a third means for guiding upward and downward movements of the first means.

According to the preferred embodiment of the present invention, the first means includes an annular baffle board. The annular baffle board has a speaker hole, a perforation hole, and a screw hole. The speaker hole is formed at a center of the baffle board, and the perforation hole and the screw hole are formed at left and right sides of the speaker hole respectively. The perforation hole and the screw hole are disposed in line with each other.

The speaker is placed in the speaker hole of the baffle board, and is fixed to the baffle board by a plurality of bolts.

The second means includes a motor for generating a rotational force, a reduction gear section for reducing the rotational force of the motor, a screw shaft rotatably connected to the reduction gear section, and a switching means for switching an operation of the motor.

The switching means includes a three-directional manual switch disposed at a lower outer wall of the enclosure. The motor rotates the screw shaft in a right direction when the three-directional switch is positioned in a first-directional position. The motor is stopped when the three-directional switch is positioned in a second-directional position. The motor rotates the screw shaft in a left direction when the three-directional switch is positioned in a third-directional position.

The third means includes a guide shaft extending from an upper end of the enclosure to a lower end of the enclosure, and a bushing fixedly inserted in the perforation hole of the baffle board. The bushing is slidably engaged with the guide shaft.

A reverse-conical cap is disposed above the enclosure in order to project an upwardly projected sound toward an exterior in 360 degrees. A conical base is disposed below the enclosure in order to project a downwards projected sound toward the exterior in 360 degrees.

When a user wishes to listen to low-frequency music such as rap or hip-hop, the user flips the three-directional switch to the first-directional position. At this time, the motor rotates the screw shaft in the right direction. Accordingly the baffle board gradually moves downward, so the volume of the upper chamber gradually increases. As a result, the resonance frequency of the upper chamber becomes lower, and the sub-woofer module can reproduce a sound having a lower frequency. At this time, since the sound projects toward the exterior of the enclosure in 360 degrees, the user may listen to a sound of the same quality regardless of the user's position in relation to the sub-woofer module.

On the other hand, when the user wishes to listen to ordinary music such as classical music or opera, the user can flip the three-directional switch to the third-directional position. At this time, the motor rotates the screw shaft in the left direction. Accordingly the baffle board gradually moves upward and the volume of the upper chamber gradually decreases. As a result, the resonance frequency of the upper chamber becomes higher.

In this manner, the user can selectively listen to music in compliance with the user's taste.

As described above, the sub-woofer module according to the present invention has following advantages.

First, the sub-woofer module according to the present invention provides a good low-frequency bass in compliance with a user' taste.

Further, since the sound projects towards the exterior in 360 degrees, the user may listen to a sound of the same quality regardless of the user's position in relation to the sub-woofer module.

BRIEF DESCRIPTION OF THE DRAWINGS

The above objects and other advantages of the present invention will become more apparent by describing in detail the preferred embodiment thereof with reference to the attached drawings, in which.

DESCRIPTION OF THE PREFERRED EMBODIMENT

Hereinafter, the present invention will be described in detail with reference to the accompanying drawings.

Figure 1:
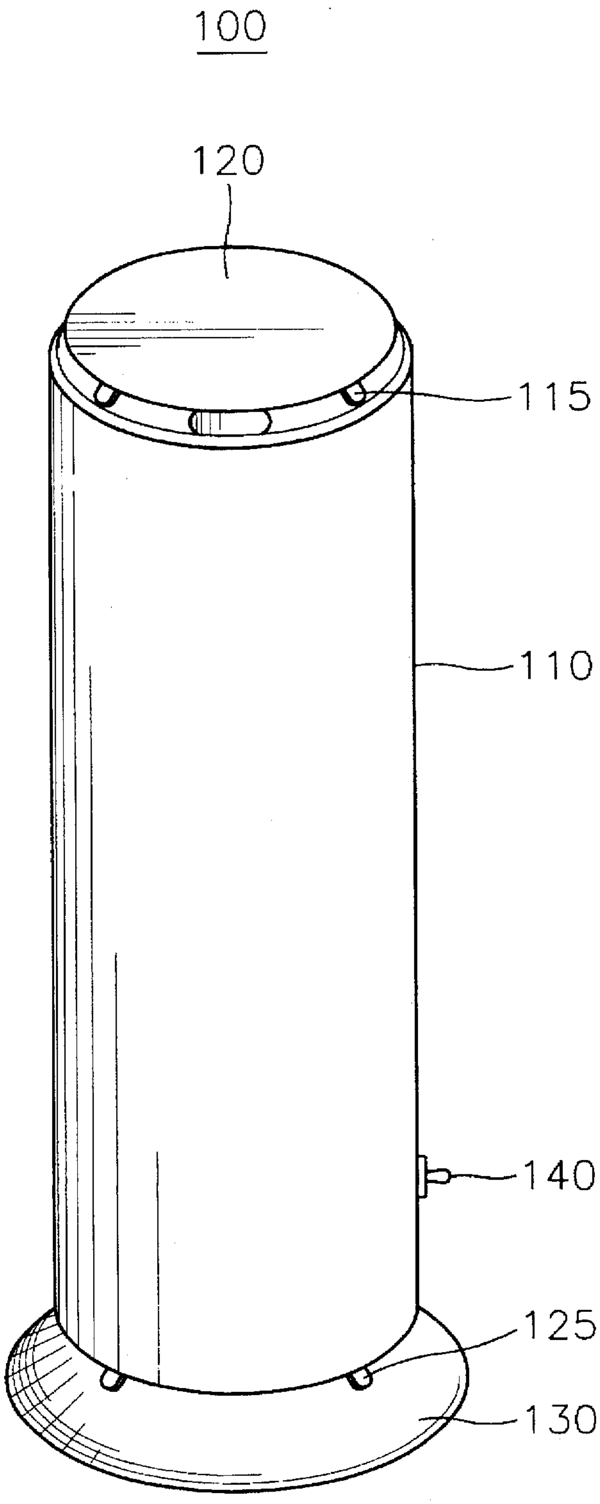
FIG. 1 is a perspective view of a sub-woofer module according to one embodiment of the present invention.

FIG. 1 is a perspective view of a sub-woofer module 100 according to one embodiment of the present invention.

As shown in FIG. 1, sub-woofer module 100 of the present invention includes a cylindrical enclosure 110. A cap 120 is attached to a top surface of enclosure 110 by a plurality of first support ribs 115, and a base 130 for supporting enclosure 110 is attached to a bottom surface of enclosure 110 by a plurality of second support ribs 125.

Figure 2:
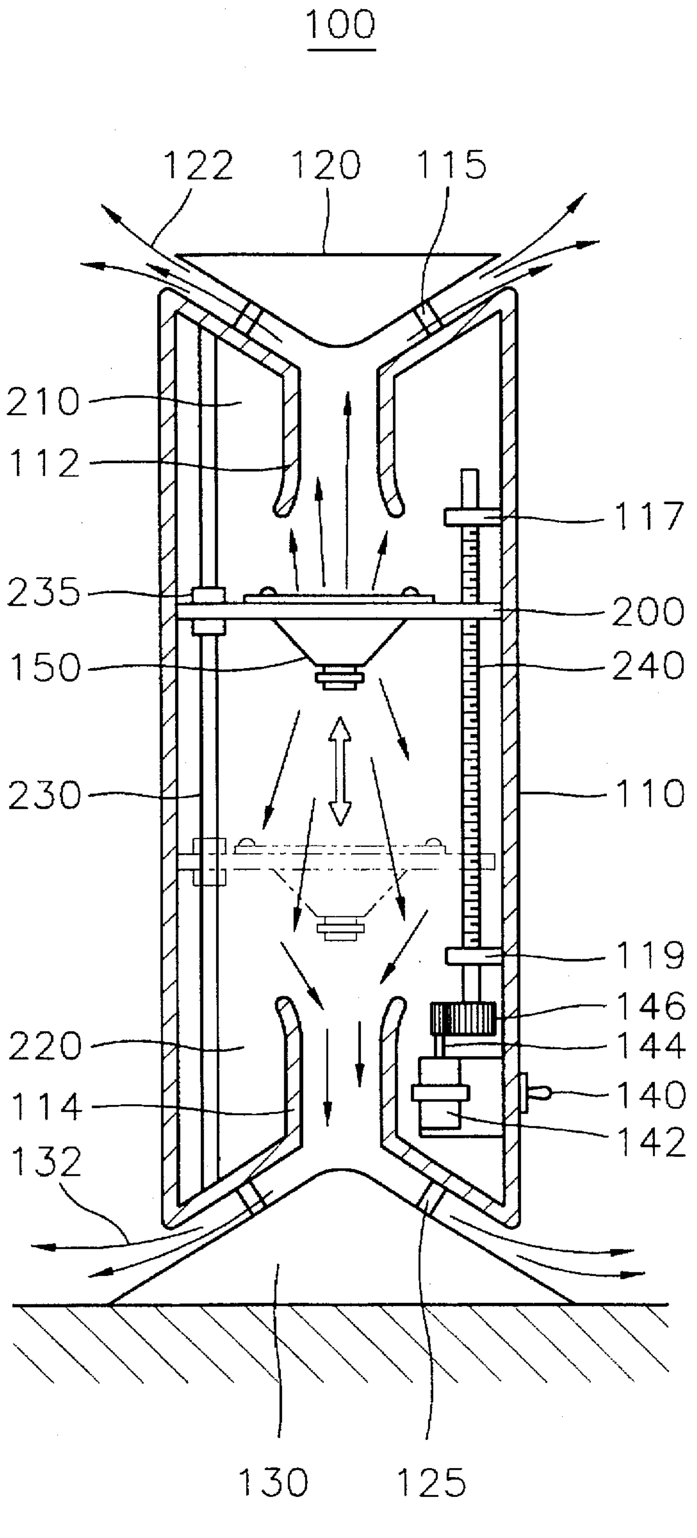
FIG. 2 is a sectional elevation view of the sub-woofer module shown in FIG. 1.

As shown in FIG. 2 in detail, cap 120 has a reverse-conical shape. Accordingly, as indicated by arrows 122, the direction of the upwardly projected sound is projected in 360 degrees as it makes contact with a bottom surface of cap 120. In addition, base 130 has a conical shape so that, as indicated by arrows 132, the direction of the downwardly sound is also projected in 360 degrees as it makes contact with a top surface of base 130. Base 130 has a diameter larger than that of enclosure 110 so as to stably support enclosure 110.

The top surface of enclosure 110 is radially inclined inwards in a direction parallel to the bottom surface of cap 120, and is formed at a center thereof with an upper duct 112 which extends downwardly to a predetermined length. The bottom surface of enclosure 110 is also radially inclined inwards in a direction parallel to the top surface of base 130, and is formed at a center thereof with a lower duct 114 which extends upward to a predetermined length. Both the diameters and the lengths of upper and lower ducts 112 and 114 are factors which determine a resonance frequency of enclosure 110, so they are predetermined when enclosure 110 is designed.

A baffle board 200, which separates enclosure 110 into upper and lower chambers 210 and 220, is installed within enclosure 110. A loudspeaker 150 for reproducing bass upwards and downwards simultaneously is coupled to baffle board 200. Baffle board 200 moves upwards and downwards along a longitudinal axis of enclosure 110, thereby varying the respective volumes of upper and lower chambers 210 and 220. As the volumes of upper and lower chambers 210 and 220 vary, their resonance frequencies are also changed. In addition, upper and lower stops 117 and 119 are respectively disposed at predetermined portions on upper and lower inner walls of enclosure 110 in order to limit the upward and downward movements of baffle board 200.

Figure 3:
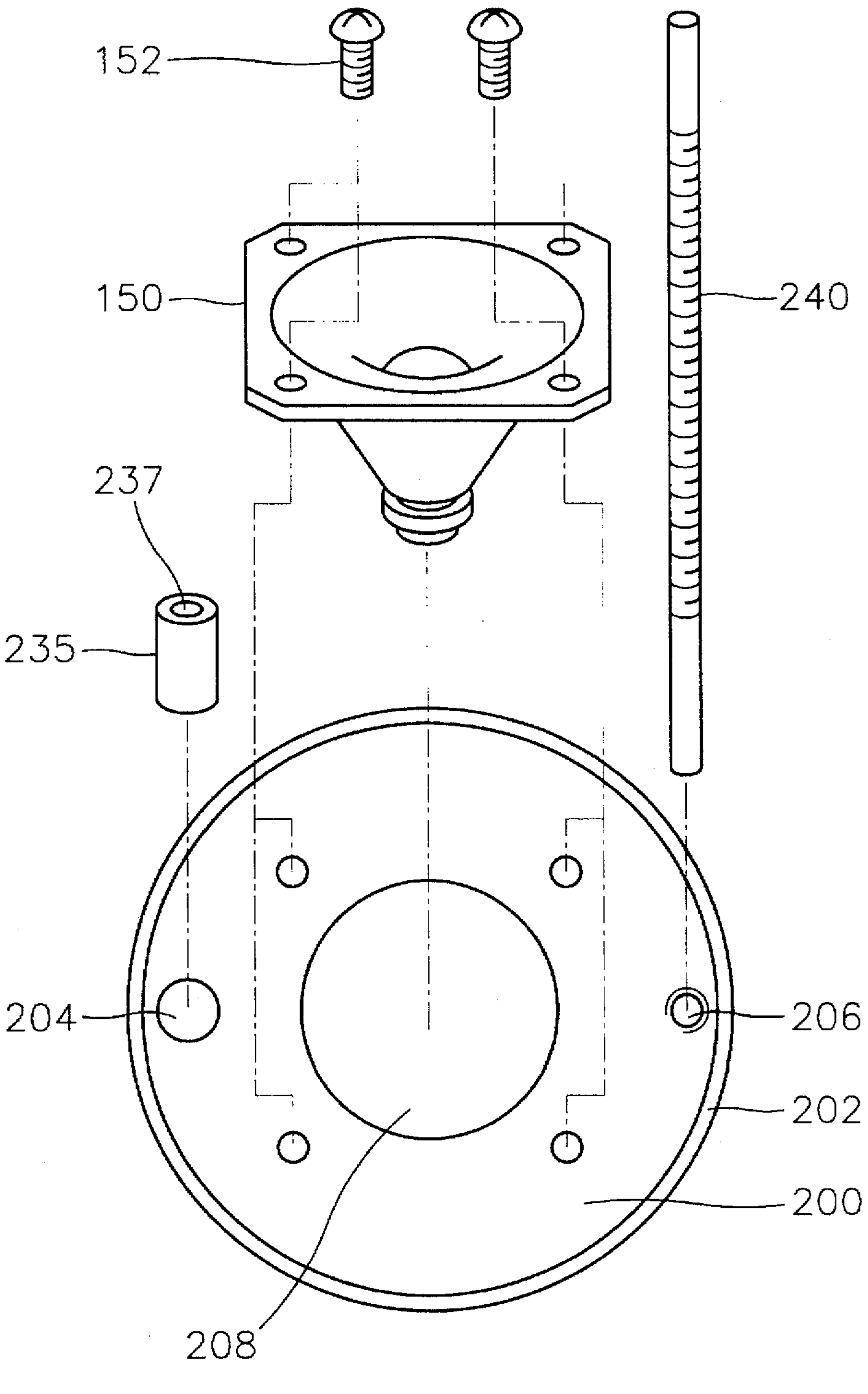
FIG. 3 is a view showing a baffle board and other elements assembled thereto.
Figure 4:
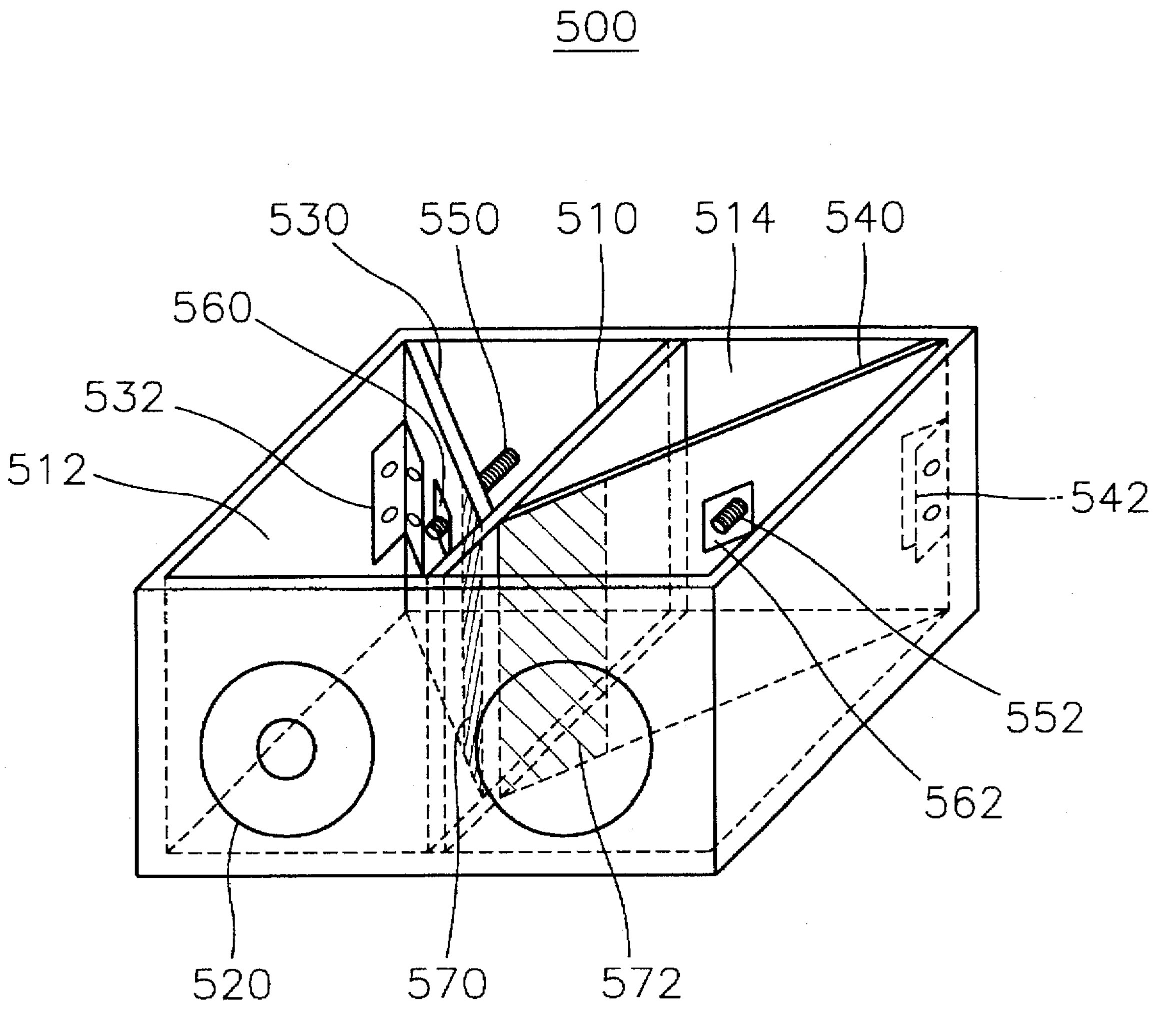
FIG. 4 (PRIOR ART)
FIG. 4 is a conventional speaker box under a normal bass mode.

As shown in FIG. 3 in detail, baffle board 200 has an annular shape, and a speaker hole 208 is formed at a center thereof. Loudspeaker 150 is placed in speaker hole 208 of baffle board 200 and is fixed thereto by a plurality of bolts 152. Baffle board 200 also has a perforation hole 204 and a screw hole 206, and these holes are formed at left and right sides of speaker hole 208 respectively, and are disposed in line with each other. A bushing 235 having a center hole 237 is fixedly inserted in perforation hole 204. Baffle board 200 has an outer diameter corresponding to an inner diameter of enclosure 110. Baffle board 200 is formed around the circumference thereof with an annular packing member 202 which slide-contacts with the inner wall of enclosure 110.

Referring again to FIG. 2, a motor 142 for generating a driving force is installed in an inner lower portion of enclosure 110. A reduction gear section 146 provided above motor 142 is connected to a motor shaft 144 so as to reduce a rotational force of motor 142. A screw shaft 240, which longitudinally extends in a direction parallel to the inner wall of enclosure 110, is rotatably connected to reduction gear section 146. Screw shaft 240 is threadedly engaged with screw hole 206 of baffle board 200 so that baffle board 200 may move upward and downward as screw shaft 240 rotates in the left and right directions. Preferably, screw shaft 240 extends beyond upper stops 117 while passing through lower and upper stops 119 and 117. Upper and lower protuberances 117 and 119 rotatably support screw shaft 240. Switch 140 for switching the operation of motor 142 is provided at a lower outer wall of enclosure 110.

On the other hand, a guide shaft 230 is provided within enclosure 110 in opposition to screw shaft 240 so as to guide the upward and downward movements of baffle board 200. Guide shaft 230 extends from an upper end of enclosure 110 to a lower end of enclosure 110. Bushing 235 fixedly inserted in perforation hole 204 is slidably engaged with guide shaft 230, thereby permitting baffle board 200 to move upward and downward.

According to a preferred embodiment of the present invention, motor 142 comprises a reversible motor. In addition, switch 140 includes a three-directional manual switch. When the three-directional switch is in its first-directional position, motor 142 rotates screw shaft 240 in the right direction. When the three-directional switch is in its second-directional position, motor 142 is stopped. When the three-directional switch is in its third-directional position, motor 142 rotates screw shaft 240 in the left direction.

According to another embodiment of the present invention, switch 140 includes a see-saw switch.

Preferably, upper and lower chambers 210 and 220 are pre-designed in such a manner that they have resonance frequencies in the range of 100–200 Hz when baffle board 200 is positioned at a mid-point of enclosure 110. In this state, both upper and lower chambers 210 and 220 have the same resonance frequency, which is defined by following equation.

$$f_1 = \frac{C}{2\pi} \sqrt{\frac{s_1}{l_1 V_1}}$$

$$f_2 = \frac{C}{2\pi} \sqrt{\frac{s_2}{l_2 V_2}}$$

(wherein, $f_1$ and $f_2$ are resonance frequencies of the upper and lower chambers respectively, $s_1$ and $s_2$ are sectional areas of the upper and lower ducts respectively, $l_1$ and $l_2$ are lengths of the upper and lower ducts respectively, $V_1$ and $V_2$ are volume of the upper and lower chambers respectively, and C is the velocity of sound)

Accordingly, the resonance frequencies $f_1$ and $f_2$ of upper and lower chambers 210 and 220 may be adjusted to a predetermined value by adjusting the factors $s_1$, $s_2$, $l_1$, $l_2$, $V_1$ and $V_2$.

As is understood from the above equation, since the resonance frequencies $f_1$ and $f_2$ of upper and lower chambers 210 and 220 are changed according to a variation in their volume, the user can selectively listen to a bass at various low-frequencies by moving baffle board 200 upwards and downwards to vary the volume of upper and lower chambers 210 and 220.

For example, when the user wishes to listen to low-frequency music such as rap or hip-hop, the user operates motor 142 by flipping three-directional switch 140 to the first-directional position. At this time, motor 142 rotates screw shaft 240 in the right direction. As screw shaft 240 rotates in the right direction, baffle board 200 threadedly engaged with screw shaft 240 gradually moves downward as shown in the dotted line in FIG. 2. Accordingly, the volume of upper chamber 210 gradually increases so that the resonance frequency of upper chamber 210 becomes lower.

As a result, sub-woofer module 100 reproduces a sound having a lower frequency. At this time, since the sound projects toward the exterior of enclosure 110 in 360 degrees, a user may listen to a sound of the same quality regardless of the user's position in relation to sub-woofer module 100. While moving baffle board 200 downward, if the user determines that a good low-frequency sound is being reproduced, the user can stop motor 142 by flipping three-directional switch 140 to the second-directional position.

On the other hand, when the user wishes to listen to ordinary music such as classical music or opera, the user can flip three-directional switch 140 to the third-directional position. At this time, motor 142 rotates screw shaft 240 in the left direction. As screw shaft 240 rotates in the left direction, baffle board 200 threadedly engaged with screw shaft 240 gradually moves upward. Accordingly, the volume of upper chamber 210 gradually decreases so that the resonance frequency of upper chamber 210 becomes higher.

While moving baffle board 200 upward, if the user determines that a sound is being properly reproduced, the user can stop motor 142 by flipping three-directional switch 140 to the second-directional position. In this manner, the user can selectively listen to music in compliance with the user's taste.

As described above, the sub-woofer module according to the present invention has following advantages.

First, the sub-woofer module according to the present invention provides a good low-frequency bass in compliance with a user' taste.

Further, since the sound projects towards the exterior in 360 degrees, the user may listen to a sound of the same quality regardless of the user's position in relation to the sub-woofer module.

While the present invention has been particularly shown and described with reference to the preferred embodiment thereof, it will be understood by those skilled in the an that various changes in form and detail may be effected therein without departing from the spirit and scope of the invention as defined by the appended claims.

What is claimed is:

1. A sub-woofer module comprising:

an enclosure;

a first means for separating the enclosure into upper and lower cheers, the first means being moved upward and downward along a longitudinal axis of the enclosure thereby varying volumes of the upper and lower chambers, the first means including an annular baffle board installed in the enclosure, the annular baffle board having a speaker hole a perforation hole, and a screw hole the speaker hole being formed at a center of the baffle board, the perforation hole being formed at a first side of the speaker hole and the screw hole being formed at a second side of the speaker hole, the first and second sides of the speaker hole being opposed to each other, the perforation hole and the screw hole being disposed in line with each other;

a speaker for projecting a sound upward and downward simultaneously, the speaker being incorporated with the annular baffle board;

a second means for moving the annular baffle board upward and downward; and a third means for guiding upward and downward movements of the annular baffle board.

2. A sub-woofer module as claimed in claim 1, wherein the annular baffle board has an outer diameter corresponding to an inner diameter of an inner wall of the enclosure, the annular baffle board having an annular packing member which is provided around a circumference of the annular baffle board, the annular packing member being slidable against the inner wall of the enclosure.

3. A sub-woofer module as claimed in claim 1, wherein the speaker is placed in the speaker hole of the baffle board, and is fixed to the baffle board by a plurality of bolts.

4. A sub-woofer module as claimed in claim 1, wherein the second means includes a motor installed in an inner lower portion of the enclosure for generating a rotational force, a reduction gear section which is provided above the motor and is connected to a motor shaft of the motor so as to reduce the rotational force of the motor, a screw shaft which is longitudinally extended in a direction parallel to an inner wall of the enclosure and is rotatably connected to the reduction gear section, and a switching means for switching an operation of the motor, the screw shaft being threadedly engaged with the screw hole of the baffle board.

5. A sub-woofer module as claimed in claim 4, wherein the motor includes a reversible motor.

6. A sub-woofer module as claimed in claim 5, wherein the switching means includes a three-directional manual switch which is disposed at a lower outer wall of the enclosure, the motor rotating the screw shaft in a right direction when the three-directional switch is positioned in a first-directional position, the motor being stopped when the three-directional switch is positioned in a second-directional position, the motor rotating the screw shaft in a left direction when the three-directional switch is positioned in a third-directional position.

7. A sub-woofer module as claimed in claim 4, wherein the switching means includes a see-saw switch which is disposed at a lower outer wall of the enclosure.

8. A sub-woofer module as claimed in claim 4, wherein the enclosure has upper and lower protuberances respectively disposed at predetermined portions on upper and lower inner walls of the enclosure in order to limit the upward and downward movements of the baffle board, the enclosure having a cylindrical shape, the screw shaft being extended passing through the lower and upper protuberances.

9. A sub-woofer module as claimed in claim 1, wherein the third means includes a guide shaft extending from an upper end of the enclosure to a lower end of the enclosure, and a bushing fixedly inserted in the perforation hole of the baffle board, the bushing being slidably engaged with the guide shaft.

10. A sub-woofer module as claimed in claim 1, further comprising a fourth means for projecting the upwardly projected sound toward an exterior in 360 degrees, the fourth means being disposed above the enclosure.

11. A sub-woofer module as claimed in claim 10, wherein the fourth means includes a cap having a reverse-conical shape.

12. A sub-woofer module as claimed in claim 11, wherein a top surface of the enclosure is radially inclined inwards in a direction parallel to a bottom surface of the reverse-conical cap, the top surface of the enclosure having an upper duct which extends downwardly to a predetermined length, the upper duct being formed at a center of the top surface of the enclosure.

13. A sub-woofer module as claimed in claim 12, wherein the reverse-conical cap is attached to the top surface of the enclosure by a plurality of support ribs, so that the bottom surface of the reverse-conical cap is spaced at a predetermined distance apart from the top surface of the enclosure.

14. A sub-woofer module as claimed in claim 1, further comprising a fourth means for projecting the downwardly projected sound toward an exterior in 360 degrees, the fourth means being disposed below the enclosure.

15. A sub-woofer module as claimed in claim 14, wherein the fourth means includes a base having a conical shape.

16. A sub-woofer module as claimed in claim 15, wherein a bottom surface of the enclosure is radially inclined inwards in a direction parallel to a top surface of the conical base, the bottom surface of the enclosure having a lower duct which extends upwardly to a predetermined length, the lower duct being formed at a center of the bottom surface of the enclosure.

17. A sub-woofer module as claimed in claim 16, wherein the conical base is attached to the bottom surface of the enclosure by a plurality of support ribs, so that the top surface of the conical base is spaced at a predetermined distance apart from the bottom surface of the enclosure.

18. A sub-woofer module comprising:

a cylindrical enclosure;

a first means for separating the enclosure into upper and lower chambers, the first means being moved upward and downward along a longitudinal axis of the enclosure thereby varying volumes of the upper and lower chambers, the first means including an annular baffle board installed in the enclosure, the annular baffle board having a speaker hole, a perforation hole, and a screw hole, the speaker hole being formed at a center of the baffle board, the perforation hole and the screw hole being formed at first and second sides of the speaker hole respectively, the first and second sides of the speaker hole being opposed to each other, the perforation hole and the screw hole being disposed in line with each other;

a speaker for projecting a sound upward and downward simultaneously, the speaker being placed in the speaker hole of the baffle board and fixed to the baffle board;

a second means for moving the annular baffle board upward and downward; and a third means for guiding upward and downward movements of the annular baffle board;

a fourth means for projecting the upwardly projected sound toward an exterior in 360 degrees, the fourth means being disposed above the enclosure; and a fifth means for projecting the downwardly projected sound toward the exterior in 360 degrees, the fifth means being disposed below the enclosure.

19. A sub-woofer module as claimed in claim 18, wherein the annular baffle board has an outer diameter corresponding to an inner diameter of an inner wall of the enclosure, the annular baffle board having an annular packing member which is slidable against the inner wall of the enclosure, the annular packing member being provided around a circumference of the annular baffle board.

20. A sub-woofer module as claimed in claim 18, wherein the second means includes a reversible motor installed in an inner lower portion of the enclosure for generating a rotational force, a reduction gear section provided above the reversible motor and connected to a motor shaft of the reversible motor so as to reduce the rotational force of the reversible motor, a screw shaft which is longitudinally extended in a direction parallel to an inner wall of the enclosure and is rotatably connected to the reduction gear section, and a three-directional manual switch for switching an operation of the reversible motor, the screw shaft being threadedly engaged with the screw hole of the baffle board, the three-directional manual switch being disposed at a lower outer wall of the enclosure.

21. A sub-woofer module as claimed in claim 20, wherein the third means includes a guide shaft extending from an upper end of the enclosure to a lower end of the enclosure, and a bushing fixedly inserted in the perforation hole of the baffle board, the bushing being slidably engaged with the guide shaft.

22. A sub-woofer module as claimed in claim 20, wherein the fourth means includes a cap, the cap having a reverse-conical shape.

23. A sub-woofer module as claimed in claim 22, wherein the enclosure has upper and lower protuberances respectively disposed at predetermined portions on upper and lower inner wall of the enclosure in order to limit the upward and downward movements of the baffle board, the screw shaft being extended passing through the lower and upper protuberances.

24. A sub-woofer module as claimed in claim 22, wherein a top surface of the enclosure is radially inclined inwards in a direction parallel to a bottom surface of the reverse-conical cap, the top surface of the enclosure having an upper duct which extends downwardly to a predetermined length, the upper duct is formed at a center of the top surface of the enclosure, the reverse-conical cap being attached to the top surface of the enclosure by a plurality of support ribs so that the bottom surface of the reverse-conical cap is spaced at a predetermined distance apart from the top surface of the enclosure.

25. A sub-woofer module as claimed in claim 20, wherein the fifth means includes a base, the base having a conical shape.

26. A sub-woofer module as claimed in claim 25, wherein a bottom surface of the enclosure is radially inclined inwards in a direction parallel to a top surface of the conical base, the bottom surface of the enclosure having a lower duct which extends upwardly to a predetermined length, the lower duct being formed at a center of the bottom surface of enclosure, the conical base being attached to the bottom surface of the enclosure by a plurality of support ribs so that the top surface of the conical base is spaced at a predetermined distance apart from the bottom surface of the enclosure.

27. A sub-woofer module comprising:

a cylindrical enclosure;

a baffle board installed in the enclosure for separating the enclosure into upper and lower chambers, the baffle board being moved upward and downward along a longitudinal axis of the enclosure thereby varying volumes of the upper and lower chambers, the baffle board having a speaker hole, a perforation hole, and a screw hole, the speaker hole being formed at a center of the baffle board, the perforation hole and the screw hole being formed at first and second sides of the speaker hole respectively, the first and second sides of the speaker hole being opposed to each other, the perforation hole and the screw hole being disposed in line with each other, the annular baffle board having an outer diameter corresponding to an inner diameter of the enclosure, the annular baffle board having an annular packing member which slide-contacts with an inner wall of the enclosure, the annular packing member being provided around a circumference of the annular baffle board;

a speaker for projecting a sound upward and downward simultaneously, the speaker being placed in the speaker hole of the baffle board and fixed to the baffle board by a plurality of bolts;

a reversible motor having a motor shaft, the reversible motor installed in an inner lower portion of the enclosure for generating a rotational force;

a reduction gear section provided above the reversible motor and connected to the motor shaft of the reversible motor so as to reduce the rotational force of the reversible motor;

a screw shaft rotatably connected to the reduction gear section, the screw shaft being longitudinally extended in a direction parallel to the inner wall of the enclosure, the screw shaft being threadedly engaged with the screw hole of the baffle board;

a three-directional switch for switching an operation of the reversible motor, the three-directional switch being disposed at a lower outer wall of the enclosure;

a guide shaft extending from an upper end of the enclosure to a lower end of the enclosure, the guide shaft being disposed in opposition to the screw shaft;

a bushing fixedly inserted in the perforation hole of the baffle board, the bushing being slidably engaged with the guide shaft;

a reverse-conical cap for projecting the sound projected upwardly by the speaker toward an exterior in 360 degrees, the reverse-conical cap being disposed above the enclosure; and a conical base for projecting the sound projected downwardly by the speaker toward the exterior in 360 degrees, the conical base being disposed below the enclosure, wherein, the enclosure has upper and lower protuberances respectively disposed at predetermined portions on upper and lower inner wall of the enclosure in order to limit the upward and downward movements of the baffle board, the screw shaft extends passing through the lower and upper protuberances, a top surface of the enclosure is radially inclined inwards in a direction parallel to a bottom surface of the reverse-conical cap, the top surface of the enclosure has an upper duct which extends downwardly to a first predetermined length, the upper duct is formed at a center of the top surface of the enclosure, the reverse-conical cap is attached to the top surface of the enclosure by a plurality of first support ribs so that the bottom surface of the reverse-conical cap is spaced at a predetermined distance apart from the top surface of the enclosure, a bottom surface of the enclosure is radially inclined inwards in a direction parallel to a top surface of the conical base, the bottom surface of the enclosure has a lower duct which extends upwardly to a second predetermined length, the lower duct is formed at a center of the bottom surface of the enclosure, the conical base is attached to the bottom surface of the enclosure by a plurality of second support ribs so that the top surface of the conical base is spaced at a predetermined distance apart from the bottom surface of the enclosure.

* * * * *